United States Patent
Ham et al.

(10) Patent No.: US 10,790,438 B2
(45) Date of Patent: Sep. 29, 2020

(54) TOUCH SENSITIVE ELEMENT, DISPLAY DEVICE COMPRISING THE SAME, AND METHOD FOR MANUFACTURING THE SAME

(71) Applicant: LG DISPLAY CO., LTD., Seoul (KR)

(72) Inventors: Yong-Su Ham, Seoul (KR); Taeheon Kim, Seoul (KR); YongWoo Lee, Goyang-si (KR); Kyungyeol Ryu, Goyang-si (KR); YuSeon Kho, Seoul (KR); MyungJin Lim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 3 days.

(21) Appl. No.: 15/822,740

(22) Filed: Nov. 27, 2017

(65) Prior Publication Data

US 2018/0164889 A1    Jun. 14, 2018

(30) Foreign Application Priority Data

Dec. 8, 2016  (KR) .......................... 10-2016-0167083

(51) Int. Cl.
*H01L 41/27* (2013.01)
*H01L 41/083* (2006.01)
(Continued)

(52) U.S. Cl.
CPC .............. *H01L 41/27* (2013.01); *B32B 37/10* (2013.01); *G06F 3/016* (2013.01); *G06F 3/0488* (2013.01);
(Continued)

(58) Field of Classification Search
CPC .................. G06F 3/016; G06F 3/0488; G06F 2203/04103; H01L 41/45; H01L 41/193; H01L 41/083; H01L 41/27; H01L 41/253
See application file for complete search history.

(56) References Cited

U.S. PATENT DOCUMENTS

| | | | |
|---|---|---|---|
| 2014/0145562 A1* | 5/2014 | Siores ................. | B29C 71/0081 310/339 |
| 2015/0206620 A1* | 7/2015 | Shin ........................ | H01B 1/22 428/457 |

(Continued)

FOREIGN PATENT DOCUMENTS

| | | | |
|---|---|---|---|
| KR | 10-2013-0089211 A | 8/2013 | |
| KR | 10-2015-0068770 A | 6/2015 | |
| WO | WO-2016047819 A1 * | 3/2016 | .............. C08L 27/16 |

OTHER PUBLICATIONS

Chemical Book, 9003-20-7(Poly(Vinyl Acetate)) Product Description, Sep. 1, 2016, Chemical Book, pp. 1-2 (Year: 2016).*

(Continued)

*Primary Examiner* — Amr A Awad
*Assistant Examiner* — Maheen I Javed
(74) *Attorney, Agent, or Firm* — Birch, Stewart, Kolasch & Birch, LLP

(57) ABSTRACT

Provided are a touch sensitive element and a manufacturing method thereof. The manufacturing method for the touch sensitive element according to an embodiment of the present disclosure includes forming an electroactive polymer coating layer by applying an electroactive polymer solution on a substrate; forming an electroactive layer by heating and pressurizing the electroactive polymer coating layer using a hot press roller; and forming an electrode on the electroactive layer.

24 Claims, 10 Drawing Sheets

(51) Int. Cl.
　　　H01L 41/45　　　(2013.01)
　　　H01L 41/193　　(2006.01)
　　　B32B 37/10　　　(2006.01)
　　　G06F 3/02　　　(2006.01)
　　　G06F 3/01　　　(2006.01)
　　　G06F 3/0488　　(2013.01)
　　　H01L 41/253　　(2013.01)
(52) U.S. Cl.
　　　CPC .......... H01L 41/083 (2013.01); H01L 41/193 (2013.01); H01L 41/253 (2013.01); H01L 41/45 (2013.01); *G06F 3/0202* (2013.01); *G06F 2203/04103* (2013.01)

(56) References Cited

U.S. PATENT DOCUMENTS

2016/0014526 A1* 1/2016 Miyoshi ................ H01L 41/183
　　　　　　　　　　　　　　　　　　　　　381/190
2018/0050528 A1* 2/2018 Jing ....................... B32B 37/10
2018/0081464 A1* 3/2018 Sunada ................... G06F 3/044

OTHER PUBLICATIONS

Furey, Edward, Percentage Difference Calculator, Jan. 9, 2016, Calculator Soup, pp. 1 (Year: 2014).*
Nasir, Muhamad et al., Formation of Beta-Phase Crystalline Structure of PVDF Nanofiber by Electrospray Deposition: Additive Effect of Ionic Fluorinated Surfactant, May 2007, Polymer Journal, vol. 39, No. 7, pp. 670-674 (Year: 2007).*
Engineering ToolBox, Resistance and Resistivity, Jul. 2, 2014, The Engineering ToolBox, pp. 1-4 (Year: 2014).*
Forest Technologies, Inc., "Application Machinery: Roll Coaters," pp. 1-2 (Year: 2013).*
Choi, Seung, Machine Translation of Foreign Patent Document WO 2016047819 A1, Method of manufacturing polymeric membrane, pp. 1-7 (Year: 2016).*

* cited by examiner

TOUCH SENSITIVE ELEMENT, DISPLAY DEVICE COMPRISING THE SAME, AND METHOD FOR MANUFACTURING THE SAME

CROSS-REFERENCE TO RELATED APPLICATIONS

This application claims the priority of Korean Patent Application No. 10-2016-0167083 filed on Dec. 8, 2016, in the Korean Intellectual Property Office, the disclosure of which is incorporated herein by reference.

BACKGROUND

Field

The present disclosure relates to a touch sensitive element, a display device including the same, and a manufacturing method thereof, and more particularly, to a touch sensitive element with an improved vibration strength and a display device including the same.

Description of the Related Art

Recently, in response to a demand of users who want to use various display devices including a liquid crystal display device and an organic light emitting display device easily, a touch type display device which touches a display device to input information is broadly used. Therefore, researches for utilizing a haptic device to provide direct and various touch feedbacks to the users are continued. Specifically, a haptic device of the related art is attached on a rear surface of a display panel, so that it is difficult to provide immediate and delicate feedback for the user's touch. Therefore, researches are actively performed to provide various and direct feedbacks which are sensitive to the user's touch by positioning the haptic device above the display panel.

According to the related art, a vibration motor such as an eccentric rotating mass ERM or a linear resonant actuator LRA is used for the display device as a haptic device. The vibration motor is configured to vibrate the entire display device. Therefore, there are problems in that a size of a mass needs to be increased in order to increase a vibration strength, it is difficult to modulate a frequency to adjust the vibration level, and a response speed is very slow. Further, the eccentric rotating mass and the linear resonant actuator are formed of an opaque material so that it is impossible to dispose the eccentric rotating mass and the linear resonant actuator above the display panel.

In order to address the above-described problems, a shape memory alloy SMA and electroactive ceramics EAC have been developed as a material for the haptic device. However, the shape memory alloy SMA has a slow response speed and a short life-span and is formed of an opaque material. Further, the electroactive ceramics EAC have a low durability against the external impact so that the electroactive ceramics are easily broken due to an external impact and are opaque. Further, it is difficult to make the electroactive ceramics thinner.

In order to address the above-described problems, a haptic device which uses an electroactive polymer EAP is studied. Since the haptic device which uses the electroactive polymer is thin and flexible, the haptic device may be easily applied to various display devices.

In order to implement the haptic device using an electroactive polymer, a method of forming an electroactive film or an electroactive layer by dissolving the electroactive polymer in a solvent to be liquified, and then performing the coating process and a baking process on the solution may be considered. However, when the above-mentioned process is used, a pore is generated in the electroactive film or the electroactive layer due to a volatilization characteristic of the solvent so that a leakage current is increased or a density and a resistance are lowered. Therefore, a sufficient vibration strength may not be achieved.

SUMMARY

An object to be achieved by the present disclosure is to provide a touch sensitive element which suppresses generation of a leakage current and a short circuit by suppressing pores from being formed in an electroactive layer and a method for manufacturing the same.

Another object to be achieved by the present disclosure is to provide a touch sensitive element which has an excellent vibration strength by improving a density of an electroactive layer and a method for manufacturing the same.

Another object to be achieved by the present disclosure is to provide a touch sensitive element which includes an electroactive layer with uniform thickness and resistance and a method for manufacturing the same.

Still another object to be achieved by the present disclosure is to provide a method for manufacturing a touch sensitive element in which an electroactive layer has a β-phase structure during a process of forming an electroactive layer and a separate polling process is not necessary.

Still another object to be achieved by the present disclosure is to provide a touch sensitive element in which a range of a drivable voltage is increased.

Objects of the present disclosure are not limited to the above-mentioned objects, and other objects, which are not mentioned above, can be clearly understood by those skilled in the art from the following descriptions.

According to an aspect of the present disclosure, there is provided a manufacturing method of a touch sensitive element. The manufacturing method includes forming an electroactive polymer coating layer by applying an electroactive polymer solution on a substrate, forming an electroactive layer by heating and pressurizing the electroactive polymer coating layer using a hot press roller, and forming an electrode on the electroactive layer.

According to another aspect of the present disclosure, there is provided a touch sensitive element. The touch sensitive element includes an electroactive layer formed of an electroactive polymer; and an electrode which is disposed on at least one surface of the electroactive layer, in which a resistance deviation of the electroactive layer represented by the following Equation 1 is 20% or lower and a drivable voltage is 50 V to 2000 V.

$$\text{Resistance Deviation} = (\text{Maximum resistance of electroactive layer} - \text{minimum resistance of electroactive layer})/\text{average resistance of electroactive layer} \times 100 \quad [\text{Equation 1}]$$

According to another aspect of the present disclosure, there is provided a touch sensitive element. The touch sensitive element includes an electroactive layer formed of an electroactive polymer, and an electrode which is disposed on at least one surface of the electroactive layer in which a resistance with respect to a thickness of the electroactive layer is $1 \times 10^9$ Ω/m to $1 \times 10^{15}$ Ω/m and a drivable voltage is 50 V to 2000 V.

Other detailed matters of the exemplary embodiments are included in the detailed description and the drawings.

According to the present disclosure, a phenomenon in which a pore is generated in an electroactive layer during the process is minimized using a hot press roller so that the leakage current and the short circuit generated due to the pore are suppressed and a density of the electroactive layer is improved, thereby improving a performance of a touch sensitive element.

Further, according to the present disclosure, an electroactive layer with uniform thickness and resistance is formed, thereby improving a performance reliability of a touch sensitive element.

Furthermore, according to the present disclosure, during the process of forming an electroactive layer without performing a separate polling process, the electroactive layer has a β-phase structure so that the performance of the touch sensitive element may be improved.

According to the present disclosure, a touch sensitive element may be driven in a broad voltage range.

The effects and advantages according to the present disclosure are not limited to the contents discussed above and below, and more various effects and advantages are provided by the various embodiments of the present disclosure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
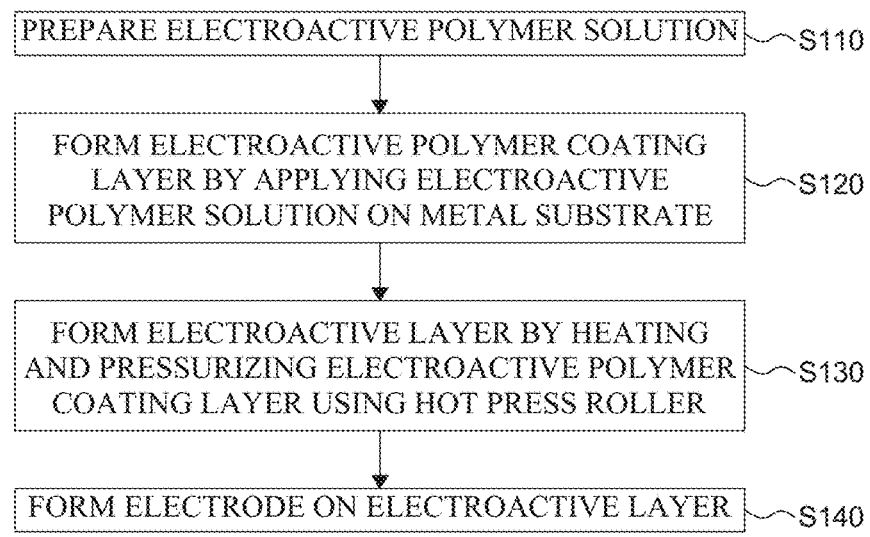
FIG. 1A is a flowchart for explaining a manufacturing method of a touch sensitive element according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used. Further, the term "may" fully encompasses the full meanings of the term "can".

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely coupled to or combined with each other and can be interlocked and operated in technically various ways, and the embodiments can be carried out independently of or in association with each other.

Hereinafter, various exemplary embodiments of the present disclosure will be described in detail with reference to accompanying drawings.

Figure 1B:
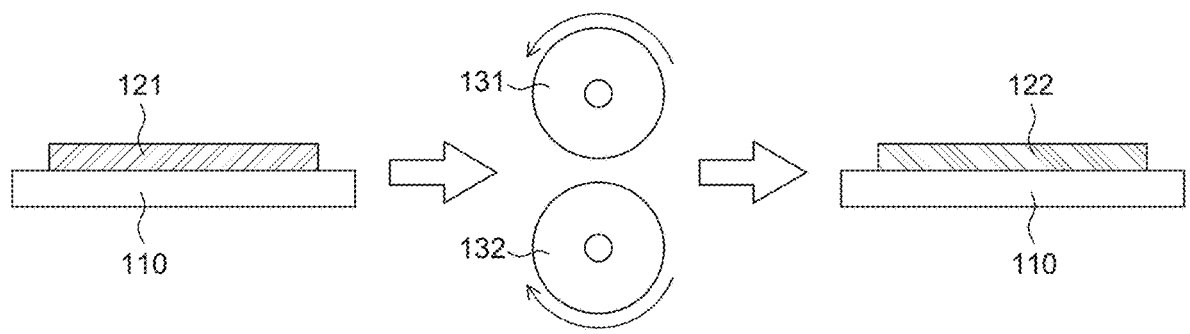
FIG. 1B is a schematic view for explaining a manufacturing method of a touch sensitive element according to an exemplary embodiment of the present disclosure.
Figure 2:
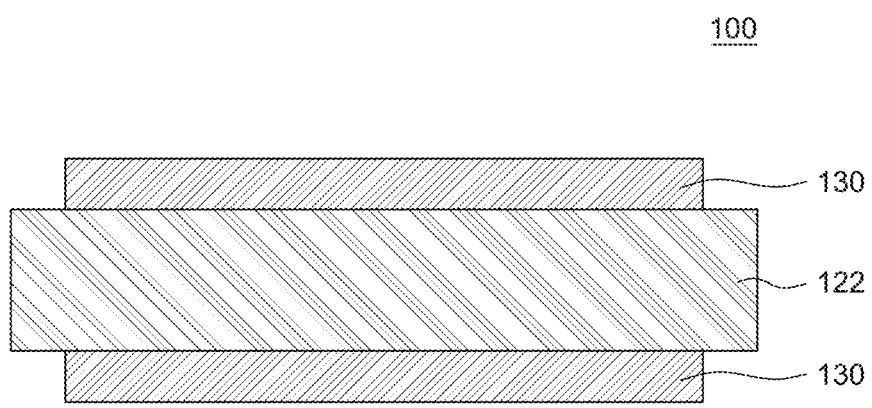
FIG. 2 is a schematic cross-sectional view for explaining a touch sensitive element according to an exemplary embodiment of the present disclosure.

FIG. 1A is a flowchart for explaining a manufacturing method of a touch sensitive element according to an exemplary embodiment of the present disclosure. FIG. 1B is a schematic view for explaining a manufacturing method of a touch sensitive element according to an exemplary embodiment of the present disclosure. FIG. 2 is a schematic cross-sectional view for explaining a touch sensitive element according to an exemplary embodiment of the present disclosure. The touch sensitive element illustrated in FIG. 2 is manufactured by a manufacturing method of a touch sensitive element according to an exemplary embodiment of the present disclosure. All the components of the touch sensitive element as well as display devices having the touch sensitive elements according to all embodiments of the present disclosure are operatively coupled and configured.

Referring to FIG. 1A, a manufacturing method of a touch sensitive element 100 according to an exemplary embodiment of the present disclosure includes a step S110 of preparing an electroactive polymer solution, a step S120 of forming an electroactive polymer coating layer 121 by applying the electroactive polymer solution on a substrate 110, a step S130 of forming an electroactive layer 122 by heating and pressurizing the electroactive polymer coating layer 121 using a hot press roller, and a step S140 of forming an electrode 130 on the electroactive layer 122.

First, the electroactive polymer solution is prepared (S110).

The electroactive polymer solution is a material for forming the electroactive layer 122 which configures the touch sensitive element 100 and refers to a solution containing an electroactive polymer. Specifically, the electroactive polymer solution includes an electroactive polymer and a solvent and further includes other additives.

The electroactive polymer is a polymer material which is deformed by an electrical stimulation. In the manufacturing method of the touch sensitive element 100 according to an exemplary embodiment of the present disclosure, the electroactive polymer is not specifically limited as long as it is a polymer which has an electroactive property and is soluble in a solvent. For example, the electroactive polymer may be a dielectric elastomer or a ferroelectric polymer. Specifically, the dielectric elastomer may be one or more kinds of selected from a group consisting of acrylic polymer, urethane polymer, and silicon polymer, but is not limited thereto. Further, the ferroelectric polymer may be polyvinylidene fluoride (hereinafter, PVDF) polymer. The PVDF polymer refers to a polymer including a PVDF repeating unit in a main chain of the polymer, and for example, may be PVDF homopolymer, PVDF copolymer, or PVDF terpolymer. When it is considered that the ferroelectric polymer has permittivity superior to the dielectric elastomer, the electroactive layer 122 may be desirably configured by the ferroelectric polymer, but is not limited thereto.

In this case, the PVDF copolymer is a binary copolymer of a VDF monomer and one monomer selected from a group consisting of trifluoroethylene TrFE, chlorotrifluoroethylene CTFE, tetrafluoroethylene TFE, chlorofluoroethylene CFE, hexafluoropropene HFP, and perfluoromethylvinylether PMVE. The PVDF terpolymer is a ternary copolymer of the VDF monomer and two kinds of monomers selected from a group consisting of TrFE, TFE, CFE, CTFE, HFP, and PMVE. For example, the PVDF copolymer or the PVDF terpolymer may be selected from a group consisting of P(VDF-CTFE), P(VDF-CFE), P(VDF-HFP), P(VDF-CDFE), P(VDF-TrFE-CTFE), P(VDF-TrFE-CFE), P(VDF-TrFE-HFP), P(VDF-TrFE-CDFE), P(VDF-TFE-CTFE), P(VDF-TFE-CFE), P(VDF-TFE-HFP), and P(VDF-TFE-CDFE).

The solvent is not specifically limited as long as it dissolves the electroactive polymer. For example, as the solvent, an organic solvent such as dimethyl formamide DMF, dimethyl sulfoxide DMSO, methylene Chloride MC, dimethyl acetamide DMAC, tetra hydrofuran THF, acetone, or ethyl acetate EA may be used.

Next, the produced electroactive polymer solution is applied on the substrate 110 to form an electroactive polymer coating layer 121 (S120).

The substrate 110 is not specifically limited as long as the substrate is a material exhibiting sufficient rigidity against heat and pressure. The substrate 110 may be formed of plastic, metal, or a conductive oxide. However, when the plastic is used for the substrate 110, the plastic may have a sufficiently high melting point so as not to be deformed during the heating and pressurizing process which is performed in a next step.

When a substrate 100 which is formed of metal or a conductive oxide is used, the substrate 110 may be used as an electrode 130 which applies a voltage to the electroactive layer 122 in a touch sensitive element 100 which is a final product. In this case, a process of forming a separate electrode 130 on the electroactive layer 122 may be saved or omitted. In this case, the substrate 110 may be a single metal layer and may have a plurality of pattern structures.

The electroactive polymer solution is applied on the substrate 110. A method for applying the electroactive polymer solution is not specifically limited as long as it can be used in the technical field of the present disclosure. For example, a spin coating method, a bar coating method, a knife coating method, a roll coating method, a blade coating method, a die coating method, a micro gravure coating method, a comma coating method, a slot die coating method, or a lip coating method may be used.

In the manufacturing method of the touch sensitive element 100 according to an exemplary embodiment of the present disclosure, the electroactive polymer solution may have sufficiently high viscosity so as not to be run down after being coated on the substrate 110. Therefore, a separate hardening process is not necessary before a hot press roller process. That is, a separate heating or hardening process may not be performed to form the electroactive polymer coating layer 121 after applying the electroactive polymer solution on the substrate 110. Therefore, the electroactive polymer coating layer 121 which is formed by applying the electroactive polymer solution on the substrate 110 may be formed as an electroactive layer 122 only by a hot press roller process which will be described below. However, in order to adjust the viscosity of the electroactive polymer solution, a heating process may be further provided as needed after coating the electroactive polymer solution on the substrate 110 and before the hot press roller process.

Next, the hot press roller is used to heat and pressurize the electroactive polymer coating layer 121 to form the electroactive layer 122 (S130). The step S130 will be more specifically described with reference to FIG. 1B.

Referring to FIG. 1B, the substrate 110 on which the electroactive polymer coating layer 121 is formed as illustrated at a left side of FIG. 1B passes through the hot press roller as illustrated at a center of FIG. 1B. The electroactive polymer coating layer 121 is heated and pressurized using the hot press roller so that the electroactive layer 122 is formed. In this case, the electroactive layer 122 may be a film type.

The hot press roller is a configuration which heats and pressurizes the electroactive polymer coating layer 121. Specifically, the hot press roller is configured by an upper roller 131 and a lower roller 132. The upper roller 131 and the lower roller 132 are spaced apart from each other with a predetermined interval. The electroactive polymer coating layer 121 is pressurized by passing the substrate 110 and the electroactive polymer coating layer 121 through the interval between the upper roller 131 and the lower roller 132. In this case, a pressure which is applied to the electroactive polymer coating layer 121 may be adjusted by adjusting the interval between the upper roller 131 and the lower roller 132.

The pressure which is applied to the electroactive polymer coating layer 121 may be diversely set according to a composition, a viscosity, and a thickness of the electroactive polymer coating layer 121. Further, the pressure may be appropriately adjusted according to a structure and a property of the electroactive layer 122 to be finally produced. The pressure which is applied to the electroactive polymer coating layer 121 may be 1 kg/cm to 50 kg/cm or desirably, 5 kg/cm to 25 kg/cm, but is not limited thereto. When the pressure which is applied to the electroactive polymer coating layer 121 satisfies the above range, the electroactive layer 122 having an appropriate thickness which allows the touch sensitive element 100 to implement a sufficient vibration strength may be formed. Further, pores or various manufacturing failures which may be caused during the process of forming the electroactive layer 122 may be minimized.

A heating unit may be mounted in the upper roller 131 and the lower roller 132. Heat which is applied to the electroactive polymer coating layer 121 may be adjusted by adjusting a temperature of the upper roller 131 and the lower roller 132.

The temperature which is applied to the electroactive polymer coating layer 121 may be diversely adjusted according to properties of the electroactive polymer coating layer 121 and the electroactive polymer which configures the electroactive polymer coating layer 121. The temperature which is applied to the electroactive polymer coating layer 121 may be equal to or higher than a melting point of the electroactive polymer included in the electroactive polymer coating layer 121, but is not limited thereto. Heat with a temperature which is equal to or higher than a melting point of the electroactive polymer is applied to the electroactive polymer coating layer 121, so that ductility of the electroactive polymer is improved to easily form the electroactive layer 122. The temperature which is applied to the electroactive polymer coating layer 121 may vary according to an electroactive polymer material, but may be 100° C. to 400° C. When the temperature which is applied to the electroactive polymer coating layer 121 satisfies the above-mentioned range, moldability of the electroactive layer 122 is improved and a pore in the electroactive polymer coating layer 121 is removed during a process of pressurizing the electroactive polymer coating layer 121. Therefore, a density of the electroactive layer 122 to be formed may be improved.

As the upper roller 131 and the lower roller 132, a metal roller in which a surface of the roller is configured by metal or a rubber roller in which a surface is configured by rubber may be used according to a material of the substrate 110, but the material of the rollers is not limited thereto.

Next, an electrode 130 is formed on the electroactive layer 122 (S140). Specifically, the electrode 130 is formed on at least one surface of the electroactive layer 122 formed using the hot press roller. The electrode 130 may be formed on the electroactive layer 122 by a method such as a sputtering, printing, or slit coating method.

Referring to FIG. 2, the electrode 130 is disposed on both surfaces of the electroactive layer 122. Therefore, when the electroactive layer 122 is formed by the step S140, the substrate 110 disposed on a lower surface of the electroactive layer 122 is separated and then the electrode 130 is formed on the lower surface and an upper surface of the electroactive layer 122. The electrode 130 may be configured by a plurality of electrodes independently on the lower surface and the upper surface of the electroactive layer 122.

Specifically, electrodes 130 may be disposed on the upper surface and the lower surface of the electroactive layer 122, respectively. In this case, each of the electrodes 130 which are disposed on the upper surface and the lower surface of the electroactive layer 122 may be a single layer. Further, the electrode 130 disposed on the upper surface of the electroactive layer 122 extends in an X-axis direction and the electrode 130 disposed on the lower surface of the electroactive layer 122 extends in a Y-axis direction to form a vertical arrangement structure in which the electrodes intersect each other to be disposed in a matrix.

In the meantime, a horizontal arrangement structure in which the electrodes 130 are disposed on only one surface of the electroactive layer 122 may be formed. For example, the substrate 110 may be formed on the upper surface or the lower surface of the electroactive layer 122 after separating the substrate 110 disposed on the lower surface of the electroactive layer 122.

Further, as mentioned in the step S120 of forming the electroactive polymer coating layer 121, the substrate 110 disposed below the electroactive polymer coating layer may be used as an electrode 130 of the touch sensitive element 100. That is, when the substrate 110 is a conductive oxide or formed of metal, the substrate 110 is not separated but may be used as a lower electrode 130 of the electroactive layer 122.

The electrode 130 is formed of a conductive material. Further, in order to secure light transmittance of the touch sensitive element 100, the electrode 130 may be formed of a transparent conductive material. For example, the electrode 130 may be formed of a transparent conductive material such as indium tin oxide ITO, indium zinc oxide IZO, graphene, metal nano wire, and transparent conductive oxide TCO. Further, the electrode 130 may be formed of a metal mesh. That is, the electrode 130 is formed of a metal mesh in which a metal material is disposed to have a mesh type so that the electrode 130 may be configured to be substantially transparently visible. However, a constituent material of the electrode 130 is not limited to the above-described example, but various transparent conductive materials may be used for the constituent material of the electrode 130. When a plurality of electrodes 130 is configured, each of the electrodes 130 may be formed of the same materials or different materials.

The manufacturing method of the touch sensitive element 100 according to an exemplary embodiment of the present disclosure simultaneously performs the heating and the pressurizing using the hot press roller after coating a solution including the electroactive polymer. Therefore, by the manufacturing method of the touch sensitive element 100 according to an exemplary embodiment of the present disclosure, an electroactive layer 122 with significantly improved density and resistance may be formed. When the density of the electroactive layer 122 is large, a stress of the electroactive layer 122 may be increased and a short circuit between electrodes may be suppressed. When the resistance of the electroactive layer 122 is large, a leakage current may be suppressed. Therefore, the vibration strength of the touch sensitive element 100 may be improved. Generally, a non-conductive material shows a tendency that as a density is increased, the resistance is increased.

More specifically, in order to form the electroactive layer including an electroactive polymer, in the related art, a solution casting method which coats a solution containing an electroactive polymer and then heats the solution to harden the coating layer is mainly used. However, when the solution casting method is used, a solvent is volatilized during a process of hardening the coating layer by heating so that a pore may be formed in the electroactive layer 122. Further, the coating layer is hardened from an outmost edge so that the solvent is not completely volatilized and remains in the electroactive layer 122. In this case, the electrodes 130 formed on and below the electroactive layer 122 are connected to each other by the pore in the electroactive layer 122 to form a short circuit. Further, a leakage current is generated due to the remaining solvent in the electroactive layer 122 so that a performance of the touch sensitive element 100 may be significantly lowered. Further, the density and the resistance in the electroactive layer 122 are reduced due to the pore in the electroactive layer 122 so that a physical strength of the electroactive layer 122 is lowered to lower a vibration strength of the touch sensitive element 100.

However, when the hot press roller is used during the process of forming the electroactive layer 122 by coating with the solution, one corner to the other corner of the coating layer is pre-compressed while the coating layer passes through a plurality of rollers. Therefore, a constant temperature and the same pressure may be applied to the coating layer. Differently from the case when the coating layer is simply heated to be hardened, heat and a pressure are simultaneously applied and the pressure is applied from one corner of the coating layer. Therefore, it is possible to minimize formation of a pore and remaining solvent in the electroactive layer 122 due to the pressure in spite of vaporization of the solvent.

Further, by the manufacturing method of the touch sensitive element 100 according to an exemplary embodiment of the present disclosure, an electroactive layer 122 with uniform thickness and resistance may be formed. That is, a thickness deviation and a resistance deviation of the electroactive layer 122 may be minimized. The electroactive layer 122 may be uniformly formed so that the electrode 130 may be uniformly formed on the surface of the electroactive layer 122. By doing this, a short circuit between the electrodes may be suppressed. Further, since the thickness and the physical properties of the electroactive layer 122 are uniform, the vibration strength according to a position is uniform. As a result, a performance reliability of the touch sensitive element 100 may be improved.

Hereinafter, the present disclosure will be described in more detail through Examples. However, the following Examples are set forth to illustrate the present disclosure, but the scope of the present disclosure is not limited thereto.

Example 1

A solution containing a PVDF copolymer was coated on an electrode formed of ITO to have a thickness of 170 μm.

An assembly including the ITO and the coating layer formed on the ITO passed through a hot press roller to form an electroactive layer. In this case, heat of 160° C. and a pressure of 10 kg/cm were applied to the coating layer formed on the ITO through the hot press roller. Next, the ITO was deposited on an upper surface of the electroactive layer to manufacture a touch sensitive element.

Comparative Example 1

An electroactive layer with the same thickness as that in Example 1 was formed on an electrode formed of ITO using a solution casting process. Next, the ITO was deposited on an upper surface of the electroactive layer to manufacture a touch sensitive element.

Experimental Example 1—Observe Surface of Electroactive Layer

Figure 3A:
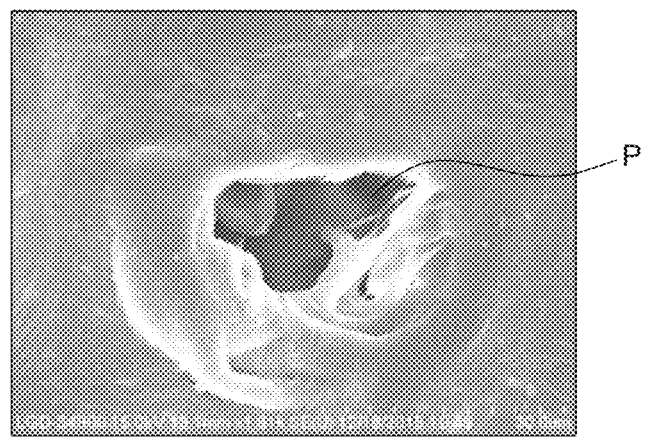
FIGS. 3A and 3B are SEM photographs obtained by photographing surfaces of electroactive layers according to Example 1 and Comparative Example 1.
Figure 3B:
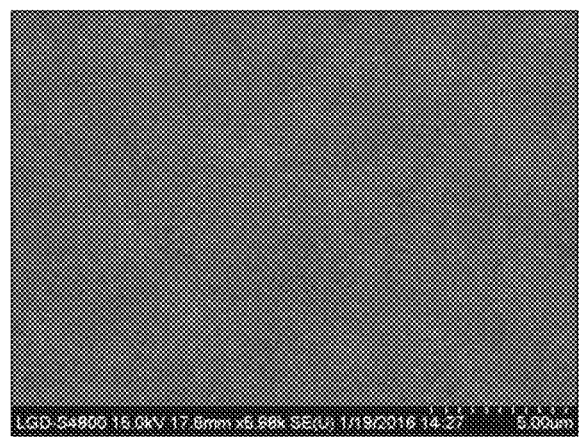

Surfaces of electroactive layers of touch sensitive elements according to Example 1 and Comparative Example 1 were photographed by a scanning electronic microscope SEM. An SEM photograph obtained by magnifying the surface of the electroactive layer according to Comparative Example 1 at 1800 magnifications is illustrated in FIG. 3A. An SEM photograph obtained by magnifying the surface of the electroactive layer according to Example 1 at 6000 magnifications is illustrated in FIG. 3B.

Referring to FIG. 3A, it was confirmed that a pore P was formed on the electroactive layer of the touch sensitive element according to Comparative Example 1. The pore was formed while the solvent was evaporated in the step of heating during the solution casting process and the pore caused the short circuit between electrodes and lowered the performance of the electroactive layer. Differently from this, referring to FIG. 3B, it was confirmed that no pore was formed on the electroactive layer of the touch sensitive element according to Example 1 and the surface of the electroactive layer was very uniformly formed.

Experimental Example 2—Evaluate Insulation Property

When an AC voltage with a frequency of 100 Hz was applied to the touch sensitive elements according to Example 1 and Comparative Example 1, whether a current flows through an electroactive layer was measured. A measurement result was illustrated in FIG. 4.

Figure 4:
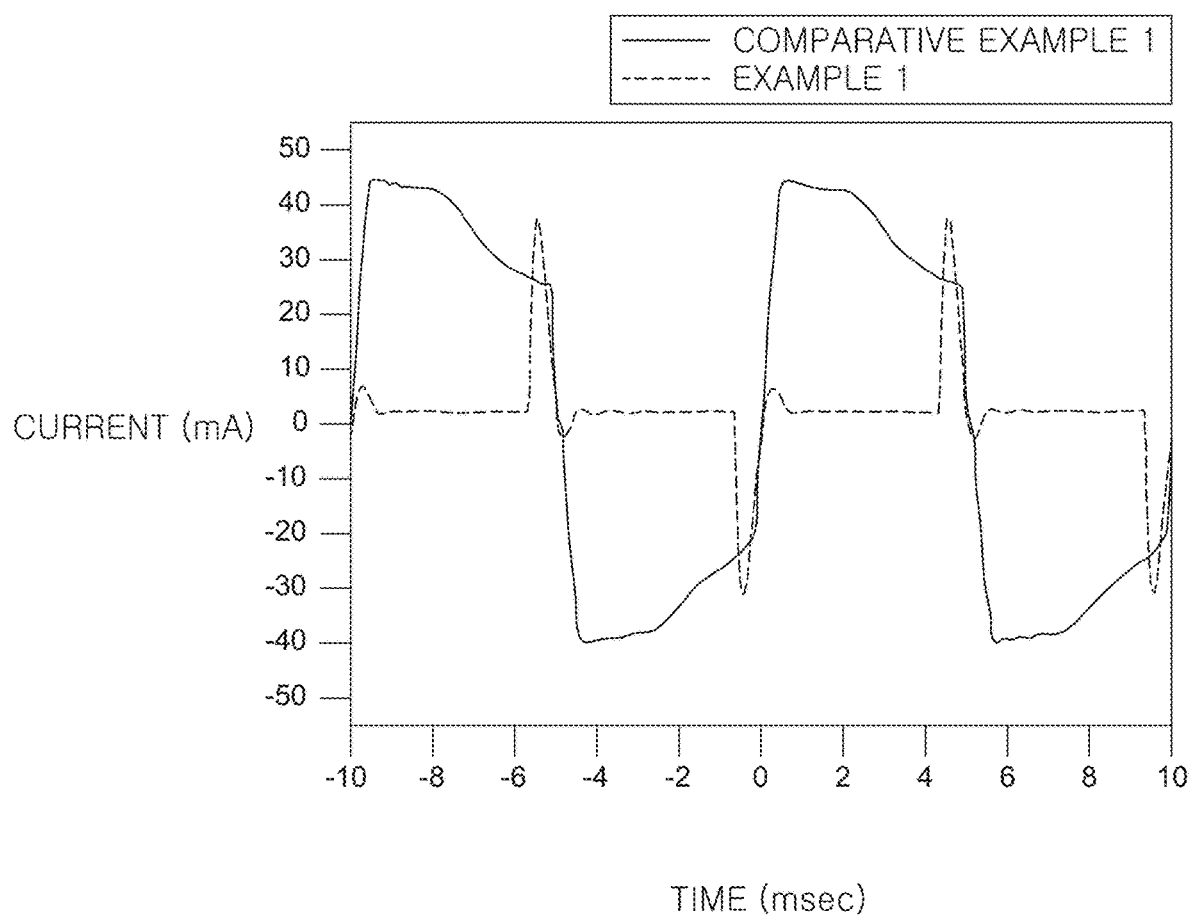
FIG. 4 is a graph for explaining whether current flows between electroactive layers when an AC voltage is applied to electroactive layers according to Example 1 and Comparative Example 1.

Referring to FIG. 4, it was confirmed that when the AC voltage was applied to the touch sensitive element according to Comparative Example 1, the current flowed between the upper electrode and the lower electrode. That is, when the electrode was deposited on the electroactive layer, an electrode material flowed into the pore formed in the electroactive layer to generate a short circuit or lower the resistance of the electroactive layer. Therefore, the current flowed. In contrast, in the touch sensitive element according to Example 1, it was confirmed that when the AC voltage was applied, the current hardly flowed. That is, the electroactive layer according to Example 1 has a higher resistance than that of the electroactive layer according to Comparative Example 1 at the same thickness so that the electroactive layer according to Example 1 has excellent insulation property.

Experimental Example 3—Evaluate Vibration Acceleration

A vibration acceleration was measured while applying an AC voltage with a frequency of 100 Hz to the touch sensitive elements according to Example 1 and Comparative Example 1 by varying the intensity of the AC voltage. A measurement result was illustrated in FIG. 5.

Figure 5:
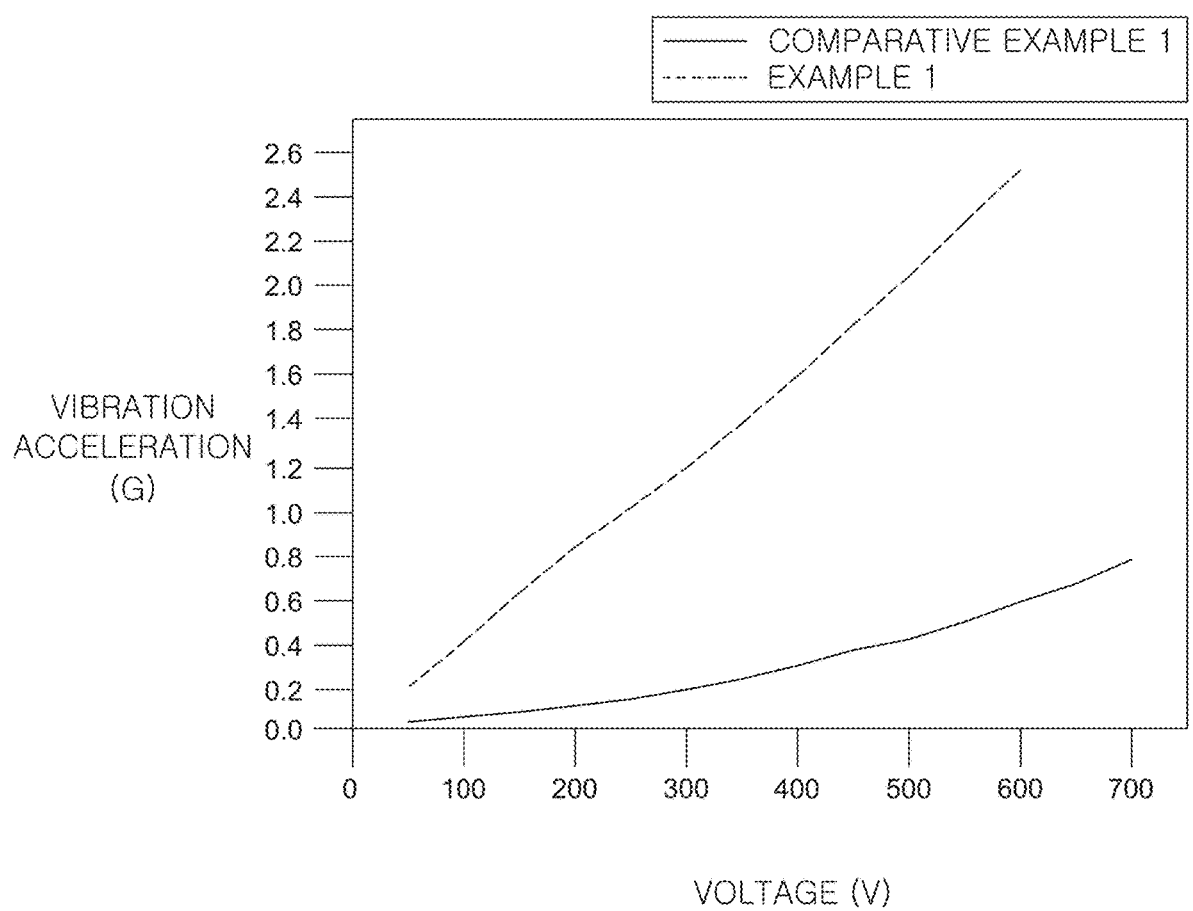
FIG. 5 is a graph for explaining a vibration strength of a touch sensitive element according to Example 1 and Comparative Example 1.

Referring to FIG. 5, it was confirmed that when the same voltage was applied, the vibration acceleration of the touch sensitive element according to Example 1 was significantly higher than the vibration acceleration of the touch sensitive element according to Comparative Example 1. The vibration acceleration of the touch sensitive element according to Example 1 was measured to be approximately eight times higher than the vibration acceleration of the touch sensitive element according to Comparative Example 1 at the same voltage. This is because the electroactive layer of the touch sensitive element according to Example 1 has few pores so that a density thereof is large.

Figure 6A:
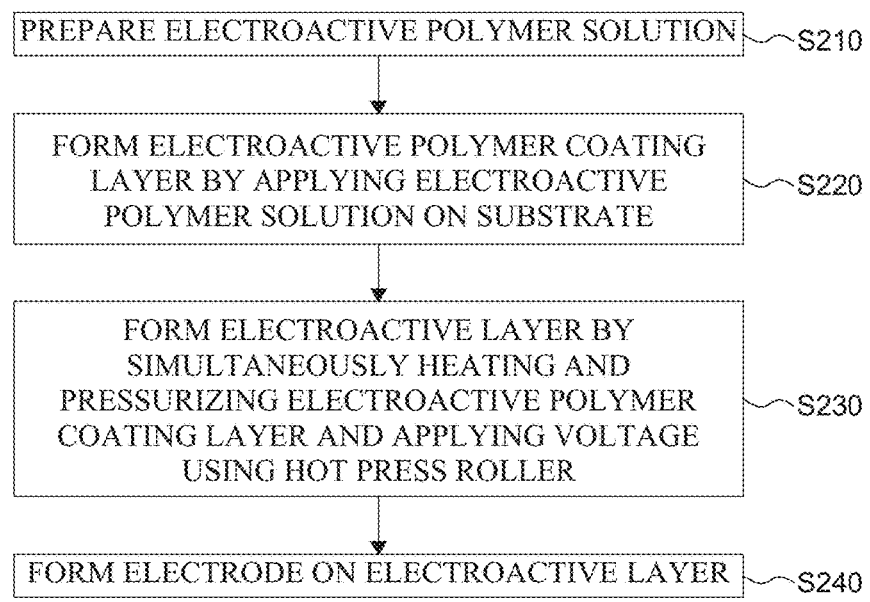
FIG. 6A is a flowchart for explaining a manufacturing method of a touch sensitive element according to another exemplary embodiment of the present disclosure.
Figure 6B:
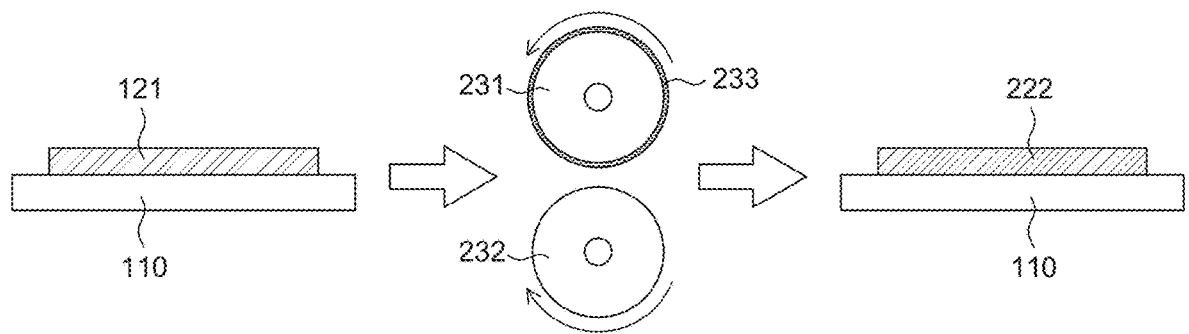
FIG. 6B is a schematic view for explaining a manufacturing method of a touch sensitive element according to another exemplary embodiment of the present disclosure.

FIG. 6A is a flowchart for explaining a manufacturing method of a touch sensitive element according to another exemplary embodiment of the present disclosure. Further, FIG. 6B is a schematic view for explaining a manufacturing method of a touch sensitive element according to another exemplary embodiment of the present disclosure.

Referring to FIG. 6A, a manufacturing method of a touch sensitive element according to another exemplary embodiment of the present disclosure includes a step S210 of preparing an electroactive polymer solution, a step S220 of forming an electroactive polymer coating layer 121 by applying the electroactive polymer solution on a substrate 110, a step S230 of forming an electroactive layer 222 by heating and pressurizing the electroactive polymer coating layer 121 and applying a voltage thereto using a hot press roller, and a step S240 of forming an electrode 130 on the electroactive layer 222.

Since in the manufacturing method of the touch sensitive element of FIG. 6A, the steps S210, S220, and S240 are performed by the same method as the manufacturing method of the touch sensitive element of FIG. 1A except the step S230, so that a description of repeated steps will be omitted.

Specifically, in the manufacturing method of the touch sensitive element according to another exemplary embodiment of the present disclosure, after forming the electroactive polymer coating layer 121 on the substrate 110, the electroactive polymer coating layer 121 is heated and pressurized and is applied with a voltage using the hot press roller to form the electroactive layer 222 (S230). The step S230 will be more specifically described with reference to FIG. 6B.

Referring to FIG. 6B, the substrate 110 on which the electroactive polymer coating layer 121 is formed as illustrated at a left side of FIG. 6B passes through the hot press roller as illustrated at a center of FIG. 6B. In this case, the hot press roller not only heats and pressurizes the electroactive polymer coating layer 121 and but also applies a voltage thereto.

In the manufacturing method of the touch sensitive element of FIG. 6A, the voltage is applied during the process of forming the electroactive layer 222, so that the electroactive layer 222 has a β-phase structure. That is, the hot press roller performs the same function as a polling process.

For example, the PVDF polymer may be subjected to a polling process to impart a permittivity and piezoelectricity. Generally, the PVDF polymer has an α-phase structure in which fluoro groups (—F) are arranged in a state in which a trans conformation and a gauche conformation are mixed along a main chain of the polymer. Since in the α-phase, fluoro groups of the PVDF polymer are disposed to be opposite to each other so that a total intensity of polarization of the α-phase is canceled and the permittivity and the piezoelectricity become very small. Therefore, when the electroactive polymer coating layer 121 passes through the hot press roller, a high voltage is applied to the PVDF polymer so that an electric field which is larger than a coercive field is formed. Therefore, the α-phase may be transformed to the β-phase in which the fluoro groups are all-trans conformation. By doing this, the intensity of polarization of the electroactive polymer of the electroactive layer 222 may be maximized and a high vibration acceleration may be implemented.

Specifically, the electroactive polymer which needs a polling process such as the PVDF copolymer may be used as an electroactive layer of the touch sensitive element through the above-described step.

In order to apply the voltage to the electroactive polymer coating layer 121, a power supply or a unit for applying a voltage may be mounted in an upper roller 231 or a lower roller 232 of the hot press roller. Referring to FIG. 6B, a conductive coating layer 233 coated with a conductive material is formed on the surface of the upper roller 231 so as to be applied with voltage. As long as the conductive coating layer 233 is a conductive material, the conductive coating layer 233 may be used without limitation. For example, the conductive material which configures the conductive coating layer 233 may be a material such as PEDOT [Poly(3,4-EthyleneDiOxyThiophene)], PSS[Poly(4-StyreneSulfonic acid)], polypyrrole, or polyaniline, but is not limited thereto.

Further, a wire may be used to apply the voltage to the upper roller 231. Specifically, in order to apply a voltage to the electroactive polymer coating layer 121 through the upper roller 231, at least a part of the conductive coating layer 233 of the upper roller 231 may be in contact with the wire. The wire may apply the voltage to the upper roller 231 from the power supply.

The voltage applied to the electroactive polymer coating layer 121 may be diversely adjusted according to a type and a physical property of the electroactive polymer. The voltage applied to the electroactive polymer coating layer 121 may be 50 V/μm to 500 V/μm, but is not limited thereto. When the voltage applied to the electroactive polymer coating layer 121 satisfies the above-mentioned range, the electroactive layer 222 may have a β-phase conformation without causing a physical damage on the electroactive polymer.

According to the manufacturing method of the touch sensitive element of FIG. 6A, after coating a solution containing an electroactive polymer, the hot press roller is used to simultaneously heat and pressurize and apply a voltage. Therefore, not only the density and the resistance of the electroactive layer 222 are improved, but also the β-phase is significantly increased so that the piezoelectricity or the permittivity of the electroactive layer 222 may be significantly improved.

Specifically, it is advantageous to simultaneously heat the electroactive polymer coating layer 121 and apply a voltage to the electroactive polymer coating layer 121. Specifically, when the electroactive layer 222 is formed, if the electroactive polymer coating layer 121 is heated, fluidity of the electroactive polymer is increased. Therefore, as compared with a case when the heating is not performed, effect by the polling process may be maximized at the same voltage. The effect may be more significant when the electroactive layer 222 is formed using a PVDF homopolymer.

As described above, in order to form the β-phase conformation, generally, the PVDF polymer may include a polling process. However, in the PVDF homopolymer, a space for forming the β-phase is insufficient due to a polymer structure. Therefore, in order to secure the space, in the related art process, a PVDF homopolymer is formed as a film and then is subjected to a stretching process. The polling process needs to be performed after stretching a main chain of the polymer by the film stretching process to remove steric hindrance between fluoro groups connected to a carbon atom. However, when the film type PVDF polymer is stretched, there is a problem in that a fine scratch like a hair line is generated and a haze is increased, so that transparency of the electroactive layer 222 is lowered. In contrast, according to the manufacturing method of a touch sensitive element according to another exemplary embodiment of the present disclosure, the PVDF copolymer may form the β-phase conformation without performing a stretching process so that no scratch is generated in the electroactive layer 222 and the haze is also maintained to be low.

Further, as the voltage is applied, the electroactive layer 222 has the β-phase conformation so that the resistance of the electroactive layer 222 is further improved. The structure of the α-phase in which fluoro groups (—F) are arranged in a state in which a trans conformation and a gauche conformation are mixed is transformed to the β-phase in which the fluoro groups are all-trans conformation, so that the dipole moment in the electric active layer 222 is aligned in the same direction, it is difficult for current to flow in the electric active layer 222.

Further, by the manufacturing method of a touch sensitive element according to an exemplary embodiment of the present disclosure, an electroactive layer 222 with uniform thickness and resistance may be formed. That is, a thickness deviation and a resistance deviation of the electroactive layer 222 may be minimized. The electroactive layer 222 may be uniformly formed so that the electrode 130 may be uniformly formed on the surface of the electroactive layer 222. Further, since the thickness and the physical properties of the electroactive layer 222 are uniform, the vibration strength according to a position is uniform. As a result, a performance reliability of the touch sensitive element may be improved.

Hereinafter, the present disclosure will be described in more detail through Examples. However, the following exemplary embodiments are set forth to illustrate the present disclosure, but the scope of the present disclosure is not limited thereto.

Example 2

A solution containing a PVDF copolymer is coated on an electrode formed of ITO to have a thickness of 170 μm. An assembly including the ITO and the coating layer formed on the ITO passed through a hot press roller to form an electroactive layer. In this case, heat of 160° C. and a pressure of 10 kg/cm were applied to the coating layer formed on the ITO and a voltage of 300 V/μm was applied through the hot press roller. Next, the ITO was deposited on an upper surface of the electroactive layer to manufacture a touch sensitive element.

Comparative Example 2

After coextruding the PVDF homopolymer to be formed as a film, a stretching process and a polling process at a voltage of 300 V/μm were performed to form an electroactive layer.

Comparative Example 3

A solution containing a PVDF copolymer is coated on an electrode formed of ITO to have a thickness of 170 μm. Therefore, the coating layer formed on the ITO through the hot press process was pressurized with heat of 160° C. and a pressure of 25 kg/cm² to form an electroactive layer. Next, the ITO was deposited on an upper surface of the electroactive layer to manufacture a touch sensitive element.

Experimental Example 4—X-Ray Diffraction Analysis (XRD Measurement)

XRD of the electroactive layer of the touch sensitive element according to not only Example 2, but also Example 1 and Comparative Example 1 was analyzed. A measurement result was illustrated in FIG. 7.

Figure 7:
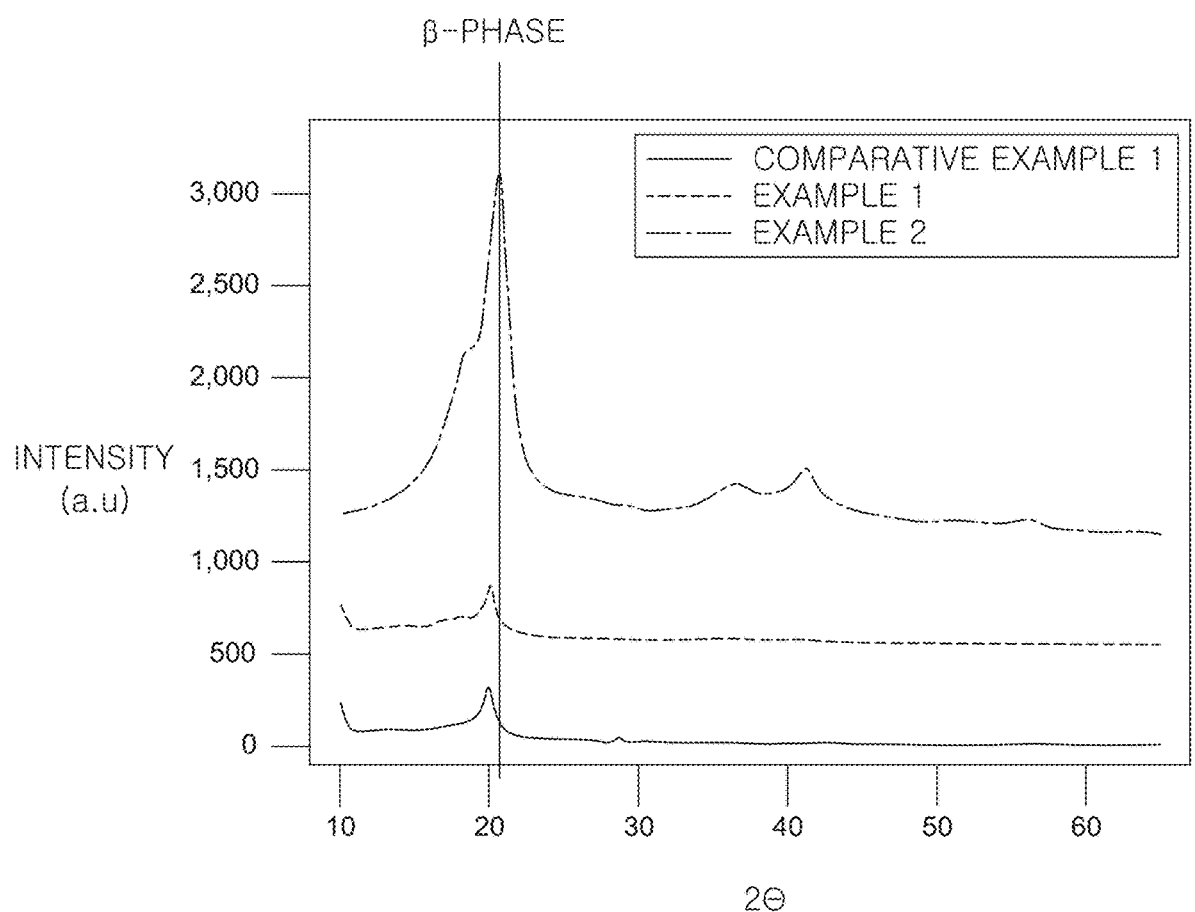
FIG. 7 is a graph illustrating an XRD analysis result of an electroactive polymer of Example 1, Example 2, and Comparative Example 1.

In the case of PVDF copolymer, as the β-phase is increased, a high peak was generated at 20.5 degrees. Referring to FIG. 7, it was confirmed that in the case of Example 2 in which the electroactive layer was formed by applying a voltage by the hot press roller, as compared with Comparative Example 1 in which the electroactive layer was formed by the solution casting process and Example 1 in which the electroactive layer was formed by applying only heat and pressure by the hot press roller, the peak at 20.5 degrees was significantly high.

Experimental Example 5—Evaluate Transparency of Electroactive Layer

Transparencies of the electroactive layers of the touch sensitive elements according to Example 2 and Comparative Example 2 were measured. Specifically, the electroactive layers according to Example 2 and Comparative Example 2 were cut to measure a haze and a light transmittance using an optical analyzer. Specific values were filled in Table 1.

TABLE 1

| Classification | Haze (%) | Light transmittance (%) |
|---|---|---|
| Example 2 | 2.1 | 92.1 |
| Comp. Ex. 2 | 9.0 | 85.0 |

Referring to Table 1, the electroactive layer of the touch sensitive element according to Example 2 had a low haze value and excellent light transmittance as compared with the electroactive layer of the touch sensitive element according to Comparative Example 2. Therefore, since the transparency of the touch sensitive element according to an exemplary embodiment of the present disclosure is excellent, it is easy to be disposed above the display panel.

Experimental Example 6—Evaluate Uniformity of Electroactive Layer

Figure 8:
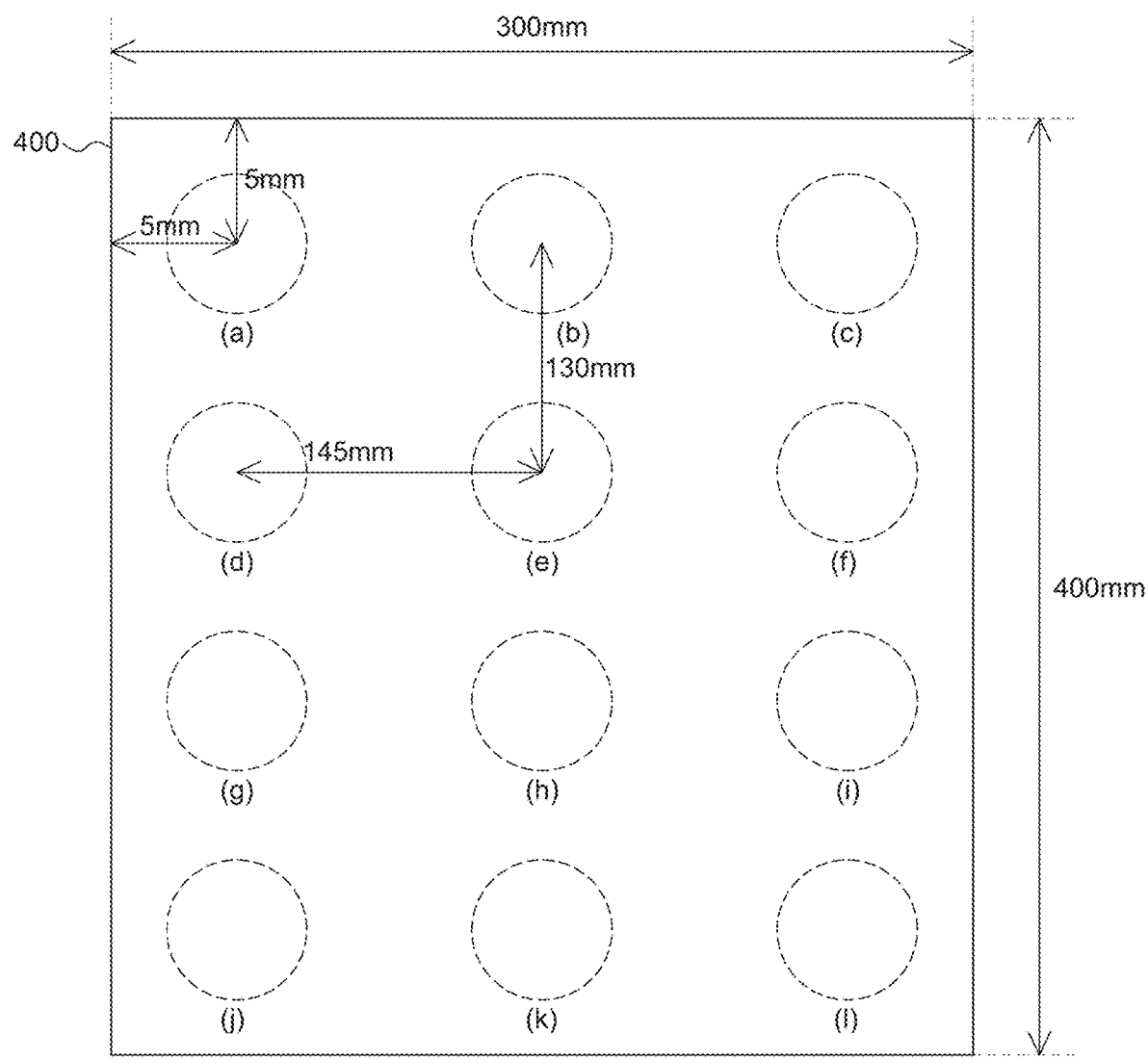
FIG. 8 is a schematic view for explaining a method for measuring thickness uniformity and resistance uniformity of electroactive layers of touch sensitive elements according to Example 1, Example 2, and Comparative Example 3.

Thickness uniformities and resistance uniformities of the electroactive layers of the touch sensitive elements according to Example 1, Example 2, and Comparative Example 3 were measured. The measuring method may be understood with reference to FIG. 8. Referring to FIG. 8, the electroactive layers of the touch sensitive elements according to Example 1, Example 2, and Comparative Example 3 were cut by 300 mm×400 mm to prepare a specimen 400. The thicknesses and the densities of the electroactive layer were measured at points indicated in FIG. 9 and the thickness deviation and the resistance deviation of the electroactive layer were calculated based on the measured value. A measurement result was filled in Table 2.

TABLE 2

|  | Comparative Example 3 | | Example 1 | | Example 2 | |
| --- | --- | --- | --- | --- | --- | --- |
| Measurement Position | Thickness (μm) | Resistance (Ω) | Thickness (μm) | Resistance (Ω) | Thickness (μm) | Resistance (Ω) |
| A | 32.2 | 1.32 k | 26.1 | 291.2 k | 25.1 | 1.21M |
| B | 31.5 | 1.28 k | 25.9 | 295.1 k | 25.0 | 1.19M |
| C | 30.9 | 2.35 k | 26.2 | 312.0 k | 24.9 | 1.15M |
| D | 29.7 | 3.33 k | 26.3 | 335.1 k | 25.2 | 1.18M |
| E | 26.5 | 36.3 k | 26.1 | 321.2 k | 25.1 | 1.23M |
| F | 29.6 | 4.35 k | 26.0 | 315.1 k | 25.2 | 1.19M |
| G | 30.0 | 3.13 k | 26.2 | 320.2 k | 25.2 | 1.21M |
| H | 26.1 | 45.1 k | 26.1 | 312.5 k | 25.1 | 1.22M |
| I | 28.9 | 5.21 k | 26.3 | 297.6 k | 25.3 | 1.18M |
| J | 30.5 | 0.98 k | 25.6 | 341.2 k | 25.0 | 1.23M |
| K | 31.2 | 1.35 k | 25.9 | 329.0 k | 24.9 | 1.19M |
| L | 32.2 | 1.21 k | 25.8 | 315.9 k | 25.1 | 1.17M |

Referring to Table 2, it was confirmed that in the electroactive layer according to Comparative Example 3 formed by uniaxially surface-pressurizing using a hot press, differences in the thicknesses and the resistances were significant at individual points as compared with the electroactive layer according to Examples 1 and 2. That is, when the electroactive layer is formed using the hot press, at a center portion of the electroactive layer, a thickness is small and a resistance is high due to the pressurization. In contrast, at an edge of the electroactive layer, the thickness is large and the resistance is low.

More specifically, a thickness deviation and a resistance deviation were measured based on the measurement value of Table 2. In this case, the thickness deviation is represented by the following Equation 2 and the resistance deviation is represented by the following Equation 1.

Resistance Deviation=(Maximum resistance of electroactive layer−minimum resistance of electroactive layer)/average resistance of electroactive layer×100   [Equation 1]

Thickness deviation=(Maximum thickness of electroactive layer−minimum thickness of electroactive layer)/average thickness of electroactive layer×100   [Equation 2]

As calculated from the thicknesses and the resistances represented in Table 2, the thickness deviation of the electroactive layer according to Comparative Example 1 is 20.42% and the resistance deviation is 499.7%. In contrast, in the case of the electroactive layer according to Example 1, the thickness deviation is 2.69% and the resistance deviation is 15.0%. In the case of the electroactive layer according to Example 2, the thickness deviation is 1.56% and the resistance deviation is 6.7%. Specifically, Comparative Example 1 shows a tendency that the thickness of the electroactive layer is increased and the resistance is decreased with moving from the center portion to the edge. However, in the case of Examples 1 and 2, the thickness and the resistance are entirely uniform. As seen from the above description, when the electroactive layer is formed using the hot press roller, the thickness and the resistance are very uniform. By doing this, a surface characteristic of the electroactive layer may be improved and a vibration strength may be significantly increased.

Experimental Example 7—Measure Drivable Voltage

A drivable voltage of the touch sensitive elements according to Examples 1 and 2 and Comparative Examples 1 and 3. The drivable voltage refers to a range from a voltage at which the touch sensitive element starts minute driving to a breakdown voltage at which the touch sensitive element stops driving. A voltage at which the driving of the touch sensitive element stops was checked by applying a voltage of 100 Hz to the touch sensitive elements according to Examples 1 and 2 and Comparative Examples 1 and 3 while increasing the voltage from 0 V. A measurement result was filled in Table 3.

TABLE 3

| Classification | Average Thickness (μm) | Breakdown Voltage (V) | Drivable Range of voltage (V) |
| --- | --- | --- | --- |
| Example 1 | 26.0 | 2000 or higher | 50 to 2000 |
| Example 2 | 25.1 | 2000 or higher | 50 to 2000 |
| Comp. Ex. 1 | 31.2 | 300 | 100 to 300 |
| Comp. Ex. 3 | 29.8 | 550 | 50 to 550 |

Referring to Table 3, it was confirmed that the drivable voltage range of the touch sensitive elements according to Examples 1 and 2 was from 50 V to 2000 V. In contrast, it was confirmed that the drivable voltage range of the touch sensitive element according to Comparative Example 1 in which the electroactive layer was formed by a solution casting method was 100 V to 300 V, which was very narrow. That is, when the electroactive layer is formed by the solution casting method, a density of the electroactive layer is very low so that a driving voltage required to start driving is high. Further, sparks may be generated at approximately 300 V or a large amount of current flows due to the pores and remaining solvent in the electroactive layer so that the operation may stop. Further, the touch sensitive element according to Example 3 in which the electroactive layer is formed using the hot press is improved as compared with the touch sensitive element according to Example 1. However, the driving voltage range is 50 V to 550 V, which is very narrow as compared with the touch sensitive elements according to Examples 1 and 2. As described above in Experimental Example 6, when the electroactive layer is formed using a hot press which applies a surface pressure, the electroactive layer is irregularly formed and pores and solvents remain in the electroactive layer. Therefore, the driving may stop at a voltage of approximately 550 V. However, differently from this, in the touch sensitive elements according to Examples 1 and 2, pores and solvents hardly remain in the electroactive layer and the thickness and resistance are uniform. Therefore, when the voltage is raised to approximately 2000 V, there are no electrode shorts and an unintended current does not flow allowing excellent driving range.

Figure 9A:
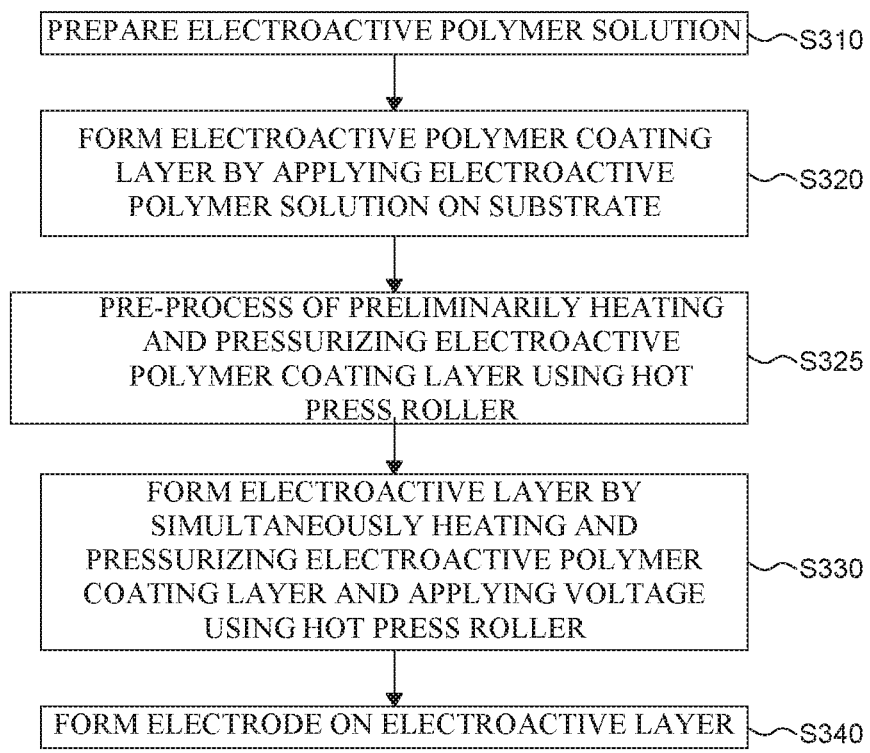
FIG. 9A is a flowchart for explaining a manufacturing method of a touch sensitive element according to still another exemplary embodiment of the present disclosure.
Figure 9B:
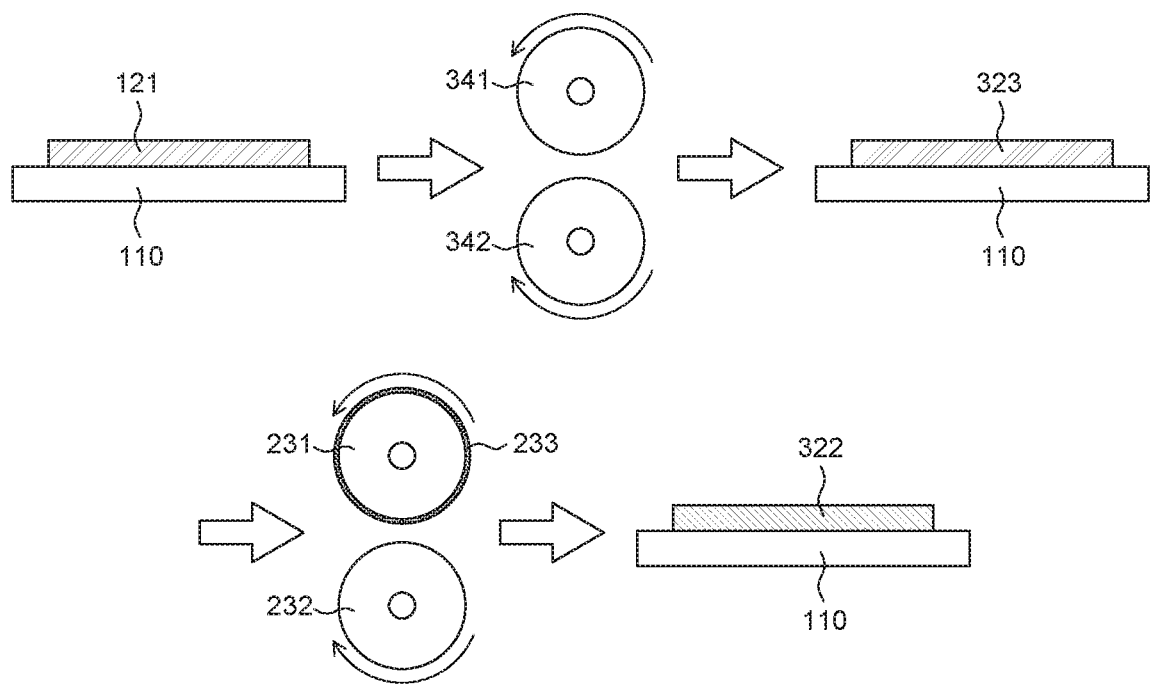
FIG. 9B is a schematic view for explaining a manufacturing method of a touch sensitive element according to still another exemplary embodiment of the present disclosure.

FIG. 9A is a flowchart for explaining a manufacturing method of a touch sensitive element according to still another exemplary embodiment of the present disclosure. Further, FIG. 9B is a schematic view for explaining a manufacturing method of a touch sensitive element according to still another exemplary embodiment of the present disclosure.

Referring to FIG. 9A, a manufacturing method of a touch sensitive element according to another exemplary embodiment of the present disclosure includes a step S310 of preparing an electroactive polymer solution, a step S320 of forming an electroactive polymer coating layer 121 by applying the electroactive polymer solution on a substrate 110, a pre-processing step S325 of preliminarily heating and pressurizing the electroactive polymer coating layer 121 using a hot press roller, a step S330 of forming an electroactive layer 322 by simultaneously heating and pressurizing the electroactive polymer coating layer 121 and applying a voltage thereto using a hot press roller, and a step S340 of forming an electrode on the electroactive layer 322.

Since the manufacturing method of a touch sensitive element of FIG. 9A is performed by the same method as the manufacturing method of the touch sensitive element of FIG. 6A except that the step S325 is further included before the step S330, so that a description of repeated steps will be omitted.

Specifically, the manufacturing method of a touch sensitive element of FIG. 9A performs the pre-processing step S325 of heating and pressurizing the electroactive polymer coating layer 121 using a hot press roller between the step S320 of forming an electroactive polymer coating layer 121 and the step S330 of forming an electroactive layer 322 by simultaneously heating and pressurizing the electroactive polymer coating layer 121 and applying a voltage thereto using a hot press roller. The step S325 will be more specifically described with reference to FIG. 9B.

Referring to FIG. 9B, the substrate 110 on which the electroactive polymer coating layer 121 is formed passes through primary hot press rollers 341 and 342 (S325). In this case, the primary hot press rollers 341 and 342 preliminarily primarily heat and primarily pressurize the electroactive polymer coating layer 121 to form an intermediate coating layer 323. Some of pores of the electroactive polymer coating layer 121 are removed by this process S325. Next, the intermediate coating layer 323 which is subjected to the pre-processing process passes through secondary hot press rollers 231 and 232 (S330). In this case, the secondary hot press rollers 231 and 232 not only heat and pressurize the electroactive polymer coating layer 121 and but also apply a voltage thereto. The remaining pores existing in the coating layer after the step S325 are removed by this process S330 and the electroactive layer 322 has a β-phase structure.

As compared with the manufacturing method of a touch sensitive element of FIG. 6A, the manufacturing method of a touch sensitive element of FIG. 9A further includes the pre-processing step S325 before the step S330 of forming the electroactive layer 322 using a hot press roller which simultaneously applies heat, a pressure, and a voltage to remove some of pores generated during a heating process. When lots of pores are generated during the process of forming the electroactive layer 322, sparks may be generated during the process of applying a voltage. Sparks physically damages the electroactive polymer and the electroactive layer 322 so that the vibration characteristic may be deteriorated. Therefore, the pores are primarily removed by the pre-processing step S325 so that the above-described problems may be suppressed in advance.

FIG. 2 is a schematic cross-sectional view for explaining a touch sensitive element according to an exemplary embodiment of the present disclosure. Referring to FIG. 2, a touch sensitive element according to an exemplary embodiment of the present disclosure includes an electroactive layer 122 and electrodes 130 disposed on an upper surface and a lower surface of the electroactive layer 122. Since the configuration of the touch sensitive element illustrated in FIG. 2 is the same as the configuration described with reference to FIGS. 1A and 1B, a redundant description will be omitted.

The touch sensitive element according to an exemplary embodiment of the present disclosure may be a touch sensitive element manufactured by the manufacturing method of the touch sensitive element illustrated in FIG. 1A or a touch sensitive element manufactured by the manufacturing method of the touch sensitive elements illustrated in FIGS. 6A and 9A.

A drivable voltage of the touch sensitive element according to an exemplary embodiment of the present disclosure is 50 V to 2000 V. The drivable voltage refers to a range from a voltage at which the touch sensitive element starts minute driving to a breakdown voltage at which the touch sensitive element stops driving. The touch sensitive element including an electroactive layer formed by a solution casting process or a surface pressurizing process using a hot press may be hardly driven at approximately 500 V or higher. In contrast, since pores and the remaining solvent in the electroactive layer are minimized and the thickness deviation and the resistance deviation of the electroactive layer are low, the touch sensitive element of the present disclosure has an excellent driving range and a driving performance.

The touch sensitive element according to the exemplary embodiment of the present disclosure includes an electroactive layer with small thickness deviation and small resistance deviation. Specifically, the resistance deviation of the electroactive layer represented by following Equation 1 may be 20% or lower and the thickness deviation represented by following Equation 2 may be 5% or lower.

Resistance Deviation=(Maximum resistance of electroactive layer−minimum resistance of electroactive layer)/average resistance of electroactive layer×100    [Equation 1]

Thickness deviation=(Maximum thickness of electroactive layer−minimum thickness of electroactive layer)/average thickness of electroactive layer×100    [Equation 2]

In this case, the maximum resistance may be a resistance at the center portion of the electroactive layer and the minimum resistance may be a resistance at the edge of the electroactive layer. Further, the maximum thickness may be a thickness at the edge of the electroactive layer and the minimum thickness may be a thickness at the center portion of the electroactive layer. The edge of the electroactive layer is an area which has a predetermined distance from the corner of the electroactive layer. More specifically, the edge of the electroactive layer may be an area having a distance which is 10% of a horizontal or vertical length of the electroactive layer from the corner of the electroactive layer. The center portion of the electroactive layer is an area in the edge.

The electroactive layer formed using a surface pressurizing process using a hot press shows a tendency that the thickness is increased and the resistance is decreased from the center portion to the edge. In contrast, the touch sensitive element manufactured by the manufacturing method of a touch sensitive element according to an exemplary embodiment of the present disclosure may include the electroactive layer in which the thickness deviation and the resistance deviation satisfy the above-mentioned ranges. When the thickness deviation and the resistance deviation of the electroactive layer satisfy the above-mentioned ranges, the electroactive layer is uniform. Therefore, the touch sensitive element in which the electrode short is minimized, the vibration strength is uniform, and the reliability is high may be provided.

In the touch sensitive element according to an exemplary embodiment of the present disclosure, a resistance with respect to the thickness of the electroactive layer may be $1 \times 10^9$ Ω/m. More specifically, a resistance with respect to the thickness of the electroactive layer may be $1 \times 10^9$ Ω/m to $1\times10^{15}$ Ω/m and may be $1\times10^{10}$ Ω/m to $1\times10^{14}$ Ω/m. Here, the resistance with respect to the thickness of the electroactive layer refers to a value obtained by dividing an average of resistances measured in individual parts of the electroactive layer by an average thickness of the electroactive layer. Therefore, when the resistance with respect to the thickness of the electroactive layer is large, the resistance of the electroactive layer is large regardless of the thickness of the electroactive layer.

In the touch sensitive element according to an exemplary embodiment of the present disclosure, as described above, the electroactive layer is formed using a hot press roller so that the pore of the electroactive layer is reduced. Therefore, the density and the resistance are significantly increased. When the resistance of the electroactive layer satisfies the above-mentioned range, the leakage current and the short circuit are minimized and the vibration strength is improved.

Figure 10:
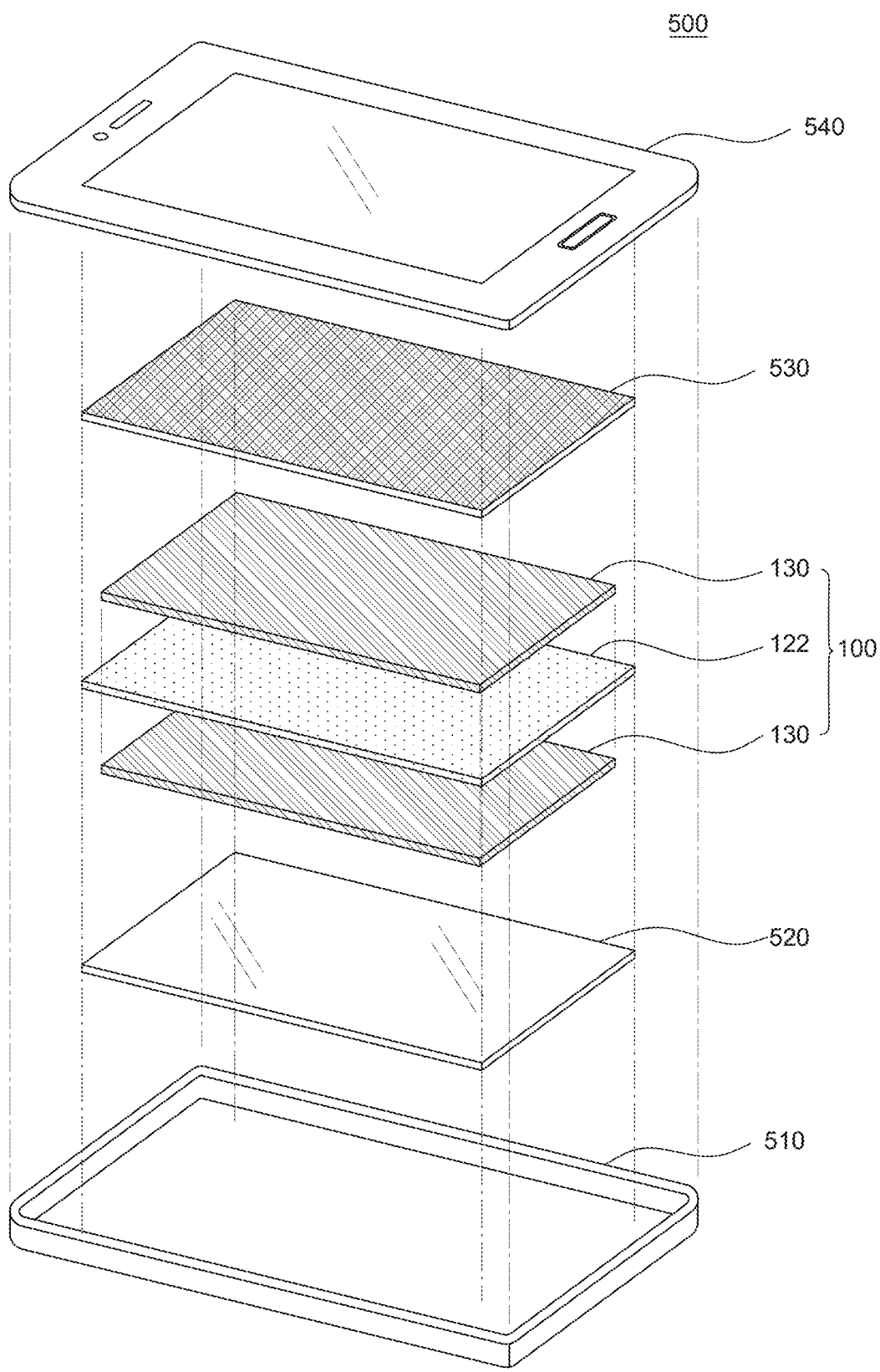
FIG. 10 is a schematic perspective view illustrating a display device according to an exemplary embodiment of the present disclosure

FIG. 10 is a schematic exploded perspective view of a display device including a touch sensitive element according to an exemplary embodiment of the present disclosure.

Referring to FIG. 10, a display device 500 according to an exemplary embodiment of the present disclosure includes a lower cover 510, a display panel 520, a touch sensitive device 100, a touch panel 530, and an upper cover 540.

The lower cover 510 is disposed below the display panel 520 so as to cover lower portions of the display panel 520, the touch sensitive device 100, and the touch panel 530. The lower cover 510 protects internal configurations of the display device 500 from the external impact or penetration of a foreign substance or moisture. For example, the lower cover 510 may be formed of plastic which is thermally formed and has a good workability or a material which may be deformed in accordance with shape deformation of the display device 500, but is not limited thereto.

The display panel 520 refers to a panel in which a display element for displaying an image in the display device 500 is disposed. As the display panel 520, for example, various display panels such as an organic light emitting display panel, a liquid crystal display panel, and an electro phoretic display panel may be used. Desirably, the display panel 520 may be an organic light emitting display device. The organic light emitting display device is a display device which flows current to an organic light emitting layer to allow the organic light emitting layer to emit light and emits light having a specific wavelength using the organic light emitting layer. The organic light emitting display device includes at least a cathode, an organic light emitting layer, and an anode.

The organic light emitting display may be configured to have ductility and be deformed. That is, the organic light emitting display device is a flexible organic light emitting display device having ductility and includes a flexible substrate. The flexible organic light emitting display device may be deformed in various directions and angles by force applied from the outside.

The touch sensitive element 100 may be disposed on the display panel 520. The touch sensitive element 100 may be disposed to be in direct contact with an upper surface of the display panel 520 or disposed between an upper surface of the display panel 520 and a lower surface of the touch sensitive element 100 using an adhesive. For example, as the adhesive, an optical clear adhesive OCA or an optical clear resin OCR may be used, but the adhesive is not limited thereto.

In the meantime, even though the touch sensitive element 100 disposed on the display panel 520 is illustrated in FIG. 10, the touch sensitive element 100 may be disposed below the display panel 520 as needed.

The touch sensitive element 100 illustrated in FIG. 10 includes an electroactive layer 122 and an electrode 130. Since the specific components of the touch sensitive element 100 are the same as the touch sensitive element 100 described with reference to FIGS. 1A and 2, a detailed description will be omitted.

The touch sensitive element 100 may be electrically connected to the display panel 520. For example, a flexible printed circuit board FPCB disposed on the display panel 520 and an electrode of the touch sensitive element 100 may be electrically connected to each other by a wiring line.

The touch panel 530 is disposed on the touch sensitive element 100. The touch panel 530 refers to a panel which performs a function of sensing a user's touch input to the display device 500 and providing a touch coordinate. The touch panel 530 may be an add-on type touch panel which is separately disposed on the display panel 520. Further, instead of the separate touch panel, an in-cell type touch sensor which is provided to be integrated with the display panel 520 may be configured.

The touch panel 530 may be classified by an operating method. For example, a capacitive type, a resistive film type, an ultrasonic type, or an infrared type may be used, but a capacitive type touch panel may be used as the touch panel 530.

Further, the touch panel 530 may be electrically connected to the touch sensitive element 100. Specifically, the touch panel 530 is electrically connected to the electrodes of the touch sensitive element 100 to transmit various touch signals or voltages input from the touch panel 530 to the touch sensitive element 100.

The upper cover 540 is disposed on the touch panel 530 so as to cover upper portions of the touch sensitive element 100, the display panel 520, and the touch panel 530. The upper cover 540 may perform the same function as the lower cover 510. Further, the upper cover 540 is also formed of the same material as the lower cover 510.

The display device 500 of the present disclosure includes a touch sensitive element 100 having an excellent vibration strength by using an electroactive layer 122 in which the pores are minimized so that the density and the resistance are improved. Further, since the display device 500 may include a touch sensitive element 100 with uniform vibration performance and a long life-span by including the electroactive layer 122 with uniform thickness and resistance. By doing this, the display device 500 may transmit excellent tactile feedbacks to a user.

The exemplary embodiments of the present disclosure can also be described as follows:

According to an aspect of the present disclosure, a manufacturing method of a touch sensitive element includes: forming an electroactive polymer coating layer by applying an electroactive polymer solution on a substrate, forming an electroactive layer by heating and pressurizing the electroactive polymer coating layer using a hot press roller, and forming an electrode on the electroactive layer.

The forming of an electroactive layer may include applying a temperature, which is equal to or higher than a melting point of the electroactive polymer, to the electroactive polymer coating layer.

The forming of an electroactive layer may include applying a pressure of 1 kg/cm to 50 kg/cm to the electroactive polymer coating layer.

In the forming of an electroactive layer, the electroactive polymer coating layer may be simultaneously heated and pressurized, and applied with a voltage.

The forming of an electroactive layer may include applying a voltage of 50 V/μm to 500 V/μm to the electroactive polymer coating layer by means of a hot press roller.

The hot press roller may have a surface coated with a conductive material to be applied with a voltage.

The manufacturing method may further include: before the forming of an electroactive layer, a pre-processing step of preliminarily heating and pressurizing the electroactive polymer coating layer by passing the electroactive polymer coating layer through the hot press roller.

The electroactive polymer solution may include a PVDF copolymer or a PVDF terpolymer.

According to another aspect of the present disclosure, a touch sensitive element includes: an electroactive layer formed of an electroactive polymer; and an electrode which is disposed on at least one surface of the electroactive layer, in which a resistance deviation of the electroactive layer represented by the following Equation 1 is 20% or lower and a drivable voltage is 50 V to 2000 V.

Resistance Deviation=(Maximum resistance of electroactive layer−minimum resistance of electroactive layer)/average resistance of electroactive layer×100  [Equation 1]

The maximum resistance may be a resistance at a center portion of the electroactive layer and the minimum resistance is a resistance at an edge of the electroactive layer.

A thickness deviation of the electroactive layer represented by the following Equation 2 may be 5% or lower.

Thickness deviation=(Maximum thickness of electroactive layer−minimum thickness of electroactive layer)/average thickness of electroactive layer×100  [Equation 2]

The electroactive polymer may be a PVDF copolymer or a PVDF terpolymer and a resistance with respect to a thickness of the electroactive layer may be $1\times10^9$ Ω/m to $1\times10^{15}$ Ω/m.

The electroactive layer may have a β-phase conformation.

According to still another aspect of the present disclosure, a touch sensitive element includes: an electroactive layer formed of an electroactive polymer, and an electrode which is disposed on at least one surface of the electroactive layer in which a resistance with respect to a thickness of the electroactive layer is $1\times10^9$ Ω/m to $1\times10^{15}$ Ω/m and a drivable voltage is 50 V to 2000 V.

A resistance deviation of the electroactive layer represented by the following Equation 1 is 20% or lower.

Resistance Deviation=(Maximum resistance of electroactive layer−minimum resistance of electroactive layer)/average resistance of electroactive layer×100  [Equation 1]

A thickness deviation of the electroactive layer represented by the following Equation 2 may be 5% or lower.

Thickness deviation=(Maximum thickness of electroactive layer−minimum thickness of electroactive layer)/average thickness of electroactive layer×100  [Equation 2]

The electroactive polymer may be a PVDF copolymer or a PVDF terpolymer.

The electroactive layer may have a β-phase conformation.

According to still another aspect of the present disclosure, a display device includes a display panel and a touch sensitive element, in which the touch sensitive element includes an electroactive layer which is formed of an electroactive polymer and has a resistance deviation represented by the following Equation 1 of 20% or lower; and an electrode which is disposed on at least one surface of the electroactive layer and a drivable voltage of the touch sensitive element is 50 V to 2000 V.

Resistance Deviation=(Maximum resistance of electroactive layer−minimum resistance of electroactive layer)/average resistance of electroactive layer×100  [Equation 1]

The maximum resistance may be a resistance at a center portion of the electroactive layer and the minimum resistance is a resistance at an edge of the electroactive layer.

A thickness deviation of the electroactive layer represented by the following Equation 2 may be 5% or lower.

Thickness deviation=(Maximum thickness of electroactive layer−minimum thickness of electroactive layer)/average thickness of electroactive layer×100  [Equation 2]

A resistance with respect to a thickness of the electroactive layer may be $1\times10^9$ Ω/m to $1\times10^{15}$ Ω/m.

The electroactive polymer may be a PVDF copolymer or a PVDF terpolymer.

The electroactive element may have a β-phase conformation.

The display panel includes a touch sensor configured to be integrated in the panel and the touch sensitive element may be disposed below the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. The protective scope of the present disclosure should be construed based on the following claims, and all the technical concepts in the equivalent scope thereof should be construed as falling within the scope of the present disclosure.

What is claimed is:

1. A manufacturing method of a touch sensitive element, the method comprising:
    forming an electroactive polymer coating layer by applying an electroactive polymer solution on a substrate;
    forming an intermediate coating layer by preliminarily heating and pressurizing the entire electroactive polymer coating layer by passing the electroactive polymer coating layer through primary hot press rollers configured by an upper primary roller and a lower primary roller;
    forming an electroactive layer by heating and pressurizing the entire intermediate coating layer using secondary hot press rollers configured by an upper secondary roller and a lower secondary roller to remove pores from the intermediate coating layer; and
    forming an electrode on the electroactive layer,
    wherein the upper primary roller and the upper secondary roller are rotated in the same direction relative to each other, and the lower primary roller and the lower secondary roller are rotated in the same direction relative to each other which is a different direction relative to that of the upper primary roller and the upper secondary roller.

2. The manufacturing method according to claim 1, wherein the forming of the electroactive layer includes:
    applying a temperature, which is equal to or higher than a melting point of the electroactive polymer, to the electroactive polymer coating layer.

3. The manufacturing method according to claim 1, wherein the forming of the electroactive layer includes:
applying a pressure of approximately 1 kg/cm² to 50 kg/cm² to the intermediate coating layer.

4. The manufacturing method according to claim 1, wherein in the forming of the electroactive layer, the intermediate coating layer is simultaneously heated and pressurized, and applied with a voltage.

5. The manufacturing method according to claim 4, wherein the forming of the electroactive layer includes:
applying a voltage of approximately 50 V/μm to 500 V/μm to the intermediate coating layer by using the secondary hot press roller.

6. The manufacturing method according to claim 4, wherein the secondary hot press roller has a surface coated with a conductive material to be applied with the voltage.

7. The manufacturing method according to claim 4, wherein the electroactive polymer solution includes a PVDF copolymer or a PVDF terpolymer.

8. A touch sensitive element, comprising:
an electroactive layer formed of an electroactive polymer; and
electrodes comprising a plurality of first electrodes on an upper surface of the electroactive layer and a plurality of second electrodes on a lower surface of the electroactive layer, each of the plurality of first electrodes extending in a first direction and each of the plurality of second electrodes extending in a second direction different from the first direction,
wherein a resistance deviation of the electroactive layer represented by the following Equation 1 is approximately 20% or lower:

Resistance Deviation=(Maximum resistance of electroactive layer minimum resistance of electroactive layer)/average resistance of electroactive layer×100, [Equation 1]

wherein a drivable voltage is approximately 50 V to 2000 V,
wherein the touch sensitive element is formed via a manufacturing method comprising:
forming an electroactive polymer coating layer by applying an electroactive polymer solution on a substrate;
forming an intermediate coating layer by preliminarily heating and pressurizing the entire electroactive polymer coating layer by passing the electroactive polymer coating layer through primary hot press rollers configured by an upper primary roller and a lower primary roller;
forming the electroactive layer by heating and pressurizing the entire intermediate coating layer secondary hot press rollers configured by an upper secondary roller and a lower secondary roller to remove pores from the intermediate coating layer; and
forming the electrodes on the electroactive layer; and
wherein the upper primary roller and the upper secondary roller are rotated in the same direction relative to each other, and the lower primary roller and the lower secondary roller are rotated in the same direction relative to each other which is a different direction relative to that of the upper primary roller and the upper secondary roller.

9. The touch sensitive element according to claim 8, wherein the maximum resistance is a resistance at a center portion of the electroactive layer and the minimum resistance is a resistance at an edge of the electroactive layer.

10. The touch sensitive element according to claim 8, wherein a thickness deviation of the electroactive layer represented by the following Equation 2 is approximately 5% or lower:

Thickness deviation=(Maximum thickness of electroactive layer−minimum thickness of electroactive layer)/average thickness of electroactive layer× 100. [Equation 2]

11. The touch sensitive element according to claim 8, wherein the electroactive polymer is a polyvinylidene fluoride (PVDF) copolymer or a PVDF terpolymer and a resistance with respect to a thickness of the electroactive layer is approximately $1 \times 10^9$ Ω/m to $1 \times 10^{15}$ Ω/m.

12. The touch sensitive element according to claim 8, wherein the electroactive layer has a β-phase conformation.

13. A touch sensitive element, comprising:
an electroactive layer formed of an electroactive polymer; and
electrodes comprising a plurality of first electrodes on an upper surface of the electroactive layer and a plurality of second electrodes on a lower surface of the electroactive layer, each of the plurality of first electrodes extending in a first direction and each of the plurality of second electrodes extending in a second direction different from the first direction,
wherein a resistance with respect to a thickness of the electroactive layer is approximately $1 \times 10^9$ Ω/m to $1 \times 10^{15}$ Ω/m,
wherein a drivable voltage is approximately 50 V to 2000 V,
wherein the touch sensitive element is formed via a manufacturing method comprising:
forming an electroactive polymer coating layer by applying an electroactive polymer solution on a substrate;
forming an intermediate coating layer by preliminarily heating and pressurizing the entire electroactive polymer coating layer by passing the electroactive polymer coating layer through primary hot press rollers configured by an upper primary roller and a lower primary roller;
forming the electroactive layer by heating and pressurizing the entire intermediate coating layer secondary hot press rollers configured by an upper secondary roller and a lower secondary roller to remove pores from the intermediate coating layer; and
forming the electrodes on the electroactive layer; and
wherein the upper primary roller and the upper secondary roller are rotated in the same direction relative to each other, and the lower primary roller and the lower secondary roller are rotated in the same direction relative to each other which is a different direction relative to that of the upper primary roller and the upper secondary roller.

14. The touch sensitive element according to claim 13, wherein a resistance deviation of the electroactive layer represented by the following Equation 1 is approximately 20% or lower:

Resistance Deviation=(Maximum resistance of electroactive layer−minimum resistance of electroactive layer)/average resistance of electroactive layer×100. [Equation 1]

15. The touch sensitive element according to claim 13, wherein a thickness deviation of the electroactive layer represented by the following Equation 2 is approximately 5% or lower:

Thickness deviation=(Maximum thickness of electroactive layer−minimum thickness of electroactive layer)/average thickness of electroactive layer× 100. [Equation 2]

16. The touch sensitive element according to claim 13, wherein the electroactive polymer is a polyvinylidene fluoride (PVDF) copolymer or a PVDF terpolymer.

17. The touch sensitive element according to claim 13, wherein the electroactive layer has a β-phase conformation.

18. A display device, comprising:
a display panel; and
a touch sensitive element,
wherein the touch sensitive element includes an electroactive layer which is formed of an electroactive polymer and has a resistance deviation represented by the following Equation 1 of approximately 20% or lower:

Resistance Deviation=(Maximum resistance of electroactive layer−minimum resistance of electroactive layer)/average resistance of electroactive layer×100, [Equation 1]

wherein the touch sensitive element further includes electrodes comprising a plurality of first electrodes on an upper surface of the electroactive layer and a plurality of second electrodes on a lower surface of the electroactive layer, each of the plurality of first electrodes extending in a first direction and each of the plurality of second electrodes extending in a second direction different from the first direction,
wherein a drivable voltage of the touch sensitive element is approximately 50 V to 2000 V,
wherein the touch sensitive element is formed via a manufacturing method comprising:
forming an electroactive polymer coating layer by applying an electroactive polymer solution on a substrate;
forming an intermediate coating layer by preliminarily heating and pressurizing the entire electroactive polymer coating layer by passing the electroactive polymer coating layer through primary hot press rollers configured by an upper primary roller and a lower primary roller;
forming the electroactive layer by heating and pressurizing the entire intermediate coating layer secondary hot press rollers configured by an upper secondary roller and a lower secondary roller to remove pores from the intermediate coating layer; and
forming the electrodes on the electroactive layer; and
wherein the upper primary roller and the upper secondary roller are rotated in the same direction relative to each other, and the lower primary roller and the lower secondary roller are rotated in the same direction relative to each other which is a different direction relative to that of the upper primary roller and the upper secondary roller.

19. The display device according to claim 18, wherein the maximum resistance is a resistance at a center portion of the electroactive layer and the minimum resistance is a resistance at an edge of the electroactive layer.

20. The display device according to claim 18, wherein a thickness deviation of the electroactive layer represented by the following Equation 2 is approximately 5% or lower:

Thickness deviation=(Maximum thickness of electroactive layer−minimum thickness of electroactive layer)/average thickness of electroactive layer× 100. [Equation 2]

21. The display device according to claim 18, wherein a resistance with respect to a thickness of the electroactive layer is approximately $1\times10^9$ Ω/m to $1\times10^{15}$ Ω/m.

22. The display device according to claim 21, wherein the electroactive polymer is a polyvinylidene fluoride (PVDF) copolymer or a PVDF terpolymer.

23. The display device according to claim 18, wherein the electroactive layer has a β-phase conformation.

24. The display device according to claim 18, wherein the display panel includes a touch sensor configured to be integrated in the display panel and the touch sensitive element is disposed below the display panel.

* * * * *